United States Patent [19]

Schneider

[11] Patent Number: 4,847,523
[45] Date of Patent: Jul. 11, 1989

[54] LOCK-IN TEST AMPLIFIER

[75] Inventor: Frank Schneider, Garching, Fed. Rep. of Germany

[73] Assignee: Max-Planck-Gesellschaft zur Foerderung der Wissenschaften e.V., Fed. Rep. of Germany

[21] Appl. No.: 85,451

[22] Filed: Aug. 14, 1987

[30] Foreign Application Priority Data

Aug. 14, 1986 [JP] Japan ..................... 3627610

[51] Int. Cl.⁴ ..................... H03K 17/16; H03K 17/28
[52] U.S. Cl. .................. 307/490; 307/244; 307/269; 307/353; 328/105; 328/153; 328/163; 328/167
[58] Field of Search ............... 307/269, 490, 494, 498, 307/520, 521, 527, 529, 353, 543, 244, 556; 328/105, 153, 163, 167

[56] References Cited

U.S. PATENT DOCUMENTS

| | | | |
|---|---|---|---|
| 3,602,826 | 8/1971 | List et al. | 307/353 |
| 3,681,701 | 8/1972 | Maier | 328/167 |
| 3,731,188 | 5/1973 | Smith | 328/167 |
| 4,511,847 | 4/1985 | Rantala | 307/529 |

Primary Examiner—John Zazworsky
Attorney, Agent, or Firm—Handal & Morofsky

[57] ABSTRACT

A lock-in amplifier having an input terminal (E); a pair of signal processing channels (16, 18) each having an input; and an output (20, 22); a pair of switching devices ($S_1$, $S_2$) coupled between the input terminal and the inputs of the signal processing channels; a signal combining circuit (24) having an output and connected between the outputs of the processing channels (16, 18); a switching control circuit (36, 38, 40, 42) having an input (SE) for a synchronizing signal, coupled to the pair of switching devices ($S_1$, $S_2$) and includes a pair of delay circuits (36, 40) connected between the synchronizing signal input (SE) and each of the associated switching devices ($S_1$, $S_2$). Each of said channels comprises a smoothing and storage network of preferably adjustable time constant.

9 Claims, 1 Drawing Sheet

LOCK-IN TEST AMPLIFIER

FIELD AND BACKGROUND OF THE INVENTION

The present invention relates broadly to a lock-in test or sensing amplifier, and more specifically to a lock-in amplifier including a switching arrangement connected between an input terminal and the inputs of two signal channels and which can be synchronized with the information component of an input signal supplied to the input terminal, a signal combining circuit coupled between the two signal channels and an output terminal, and a switch control device connected between the synchronizing signal input terminal and a switching device.

For the selective amplification of an information carrying signal having a given frequency and onto which an interfering signal of a different frequency and/or stochastic noises are superimposed, frequently lock-in amplifiers are used. In such known amplifiers the input signal which is to be processed and which contains the information carrying signal and the noises, is correlated with a reference signal, which has the same frequency as the information carrying signal. The correlation can be accomplished with a simple switching arrangement or with a mixer or with a multiplying circuit. The signal which is obtained after the correlation must be thereafter passed through a low-pass filter in order to free it from the reference frequency and also must be smoothed-out or filtered. The resulting means value signal is still dependent from the sampling ratio of the reference signal. The largest signal-to-noise ratio is obtained at a sampling ratio of 1:1, that is with a sinusoidal reference signal.

Many measurements result in an electrical signal in which the sections containing the useful information periodically alternate with sections which contain the reference information. Frequently, a similar time period for the segments containing the useful information and for the segments containing the reference information cannot be had, that is, the sampling ratio 1:1 is impossible or not realistic. This is the case when a pulsed process requires time for the regeneration or in the opposite case, when the flow of information of a process should be measured possibly in a continuous fashion, and the zero point must be checked only occasionally. For such purpose the known lock-in amplifiers are not satisfactory.

When the operation of the switching process causes a temporary cross-talk or non-linear distortions or interferences, such cannot be taken care of by the known lock-in amplifiers in an optimum fashion.

SUMMARY AND OBJECTS OF THE INVENTION

An object of the present invention is to provide a lock-in amplifier which is more adaptable than the above discussed amplifiers and in addition, due to its separate channels having optimum filtering therein, it is characterized by a larger measuring dynamics and due to its cutting out of the signal segments which contain no information or which contain noise, it is also characterized by a much higher signal-to-noise ratio, while at the same time, it requires a relatively simple layout.

According to the present invention, the lock-in amplifier comprises a switching arrangement connected between an input terminal and the inputs of two signal channels and which can be synchronized with an input signal supplied to the input terminal and containing an information component, a signal combining circuit coupled between the two signal channels and an output terminal, a switch control arrangement connected between an input terminal for the synchronizing signal and a switching arrangement, and the improvement is characterized in that the switching arrangement includes a pair of independently controllable switching means, that the switch control arrangement for each switching means includes delay means connected between the synchronizing signal input terminal and the respective switching means, and that each of said channels comprises smoothing or filtering and storage means.

Preferably the delay time of the delay means can be independently set.

The switch controlling arrangement preferably may contain for each switching means an individual clock circuit, which produces a signal controlling the switching or closing of the associated switching means, and wherein the period of the control signal of the clock circuit for the controlling of the switching means can be set independently from each other.

According to the present invention each signal channel contains its own smoothing and storage means and the time constant of each smoothing and storage member preferably can be set individually. The signal combining circuit contains preferably a differential amplifier. The signal combining circuit may contain its own smoothing or filtering means. Each signal channel may contain an isolating amplifier.

BRIEF DESCRIPTION OF THE DRAWING

The present invention may become apparent from the following description of preferred embodiments thereof, shown, by the example, in the accompanying drawing, in which.

DESCRIPTION OF THE PREFERRED EMBODIMENTS

Figure 1:
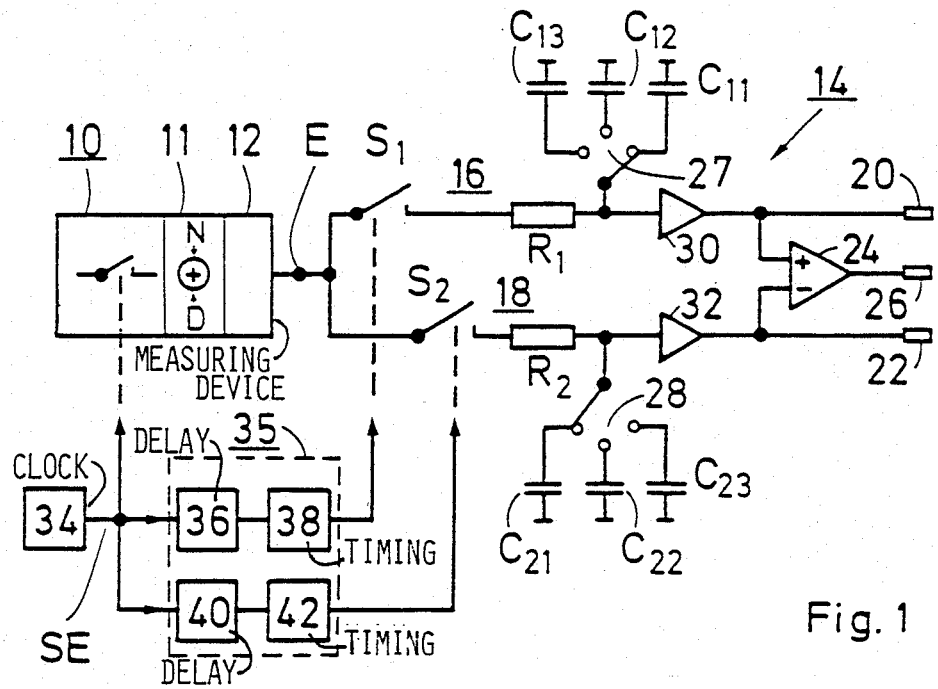
FIG. 1 illustrates the switching arrangement in a circuit form of a preferred embodiment of a lock-in amplifier according to the present invention.

With reference to FIG. 1 it is seen that block 10 and the switching sign illustrated therein shows a switched or keyed physical or technical process in a symbolic fashion.

A parameter of interest of the process which unavoidably has interference signals, such as Noise and Drift effects superimposed thereon, and which are illustrated in block 11 by the adding symbol in a schematic fashion, is measured by the measuring device 12. As a result one obtains on a terminal E an electric signal in which information containing segments having superimposed noises periodically alternate in step with the switching frequency with segments containing reference information, and also segments which contain no information component.

For the selected amplification of the desired and useful information a lock-in amplifier 14 is provided according to the present invention and which is synchronized with the switching frequency of the process 10. The lock-in amplifier 14 contains two separate channels 16 and 18, the inputs of which are respectively connected with the terminal E through switching means $S_1$ and $S_2$ which can be considered also as the input terminals for the lock-in amplifier circuit. The outputs of the channels 16 and 18 are coupled on one hand with output terminals 20 and 22, respectively, while on the other hand they are coupled also with the non-inverting and inverting input of a differential amplifier 24, respectively, which on a further output terminal 26 thereof produces a differential signal.

Each of the channels contains storage and a smoothing network in the form of an integrating circuit including a series resistance R1 and R2, respectively, and capacitors C11, C12 or C13, respectively C21, C22 respectively C23, which can be selectively switched into the circuit by switching means 27, respectively 28. The integrating circuit is followed in each branch by an isolating amplifier 30, respectively 32. The outputs of the isolating amplifiers are respectively connected with one of the output terminals 20, 22 and with an input of the differential amplifier 24. On the output terminals 20, 22 the information is available which is selected by the associated switches $S_1$ or $S_2$.

The switching or keying frequency of the process 10 can be controlled by a clock generator 34 in a desired manner periodically or, in a given case, also in an a periodic fashion. The output signal of the clock generator 34 controls a switching circuit 35, the input terminal of which is identified by the reference character SE. In the illustrated switching circuit 35 the output signal of the clock circuit 34 controls over a settable delay means 36 and a settable timing circuit 38 the time period and the period of the closure of switching means $S_1$, as well as over a second settable delay means 40 and a second timing circuit 42, the closing instant and the period of closing of switching means $S_2$. The delay means and the timing circuit can be made up from monostable multivibrator circuits. By the delay means 36, 40 one may set in any desirable fashion the time period between the front or trailing edge of the keying pulses coming from the clock generator 34 controlling the process 10 and the period of closing of the switches $S_1$ and $S_2$. By the timing circuits 38 and 42 the closing period of the switches $S_1$ and $S_2$ can be set independently from each other.

As a result, one is, therefore, free in selecting the segments of the input signal on terminal E which should be supplied to channel 16 or channel 18, and also free in the selection of the sampling ratio of the signal segments which should be supplied to both of the channels.

The signal segments selected by means of the switching devices $S_1$ and $S_2$ are supplied over the smoothing or filtering resistors R1 and R2 to the capacitors of the integrating circuit and become stored therein. On the outputs 20 and 22 one will obtain the average value of the selected signals. Since the switching noises of the process 10 do not need to be filtered out anymore, the smoothing or filtering time constants R1, C1 or R2, C2 can be selected in a desired manner, which also enable to appropriately adapt the high frequency noise treatment to the measuring signal in an optimum fashion. As a result, a substantial increase in the measuring dynamics can be attained, especially in processes, which can be handled only by relatively low sampling frequency. On the outputs 20 and 22 the "phase values" U1 and U2 are available separately as an additional information.

Figure 2:
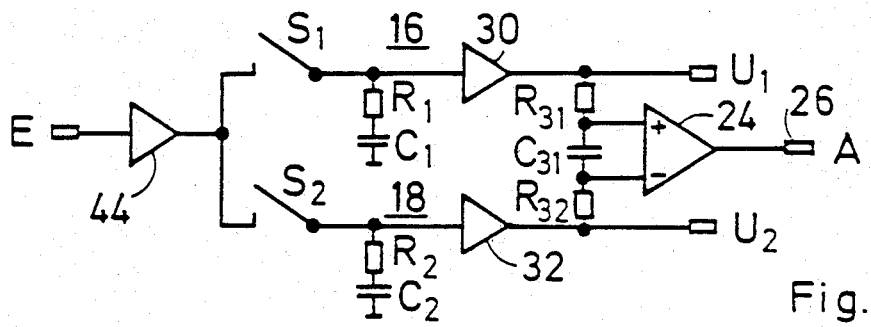
FIG. 2 is another embodiment of the switching arrangement to FIG. 1, illustrating only the portion where the variation is present.

The embodiment of the lock-in amplifier illustrated in FIG. 2 differs from the lock-in amplifier 14 of FIG. 1 substantially in the following manner: Between the input terminal E and the switching means $S_1$ and $S_2$ an additional isolating amplifier 44 is connected. The storage means include a series connection of a resistor R1 and of a capacitor C1, respectively R2, C2, which are connected between the conductor connecting the switching means $S_1$ and $S_2$ and the associated amplifiers 30, respectively 32 on one hand, and ground on the other hand. Furthermore, to the input of the differential amplifier 24 a smoothing or filter circuit is connected which includes a resistor R31 which is connected between the output of the amplifier 30 and the non-inverting input of the differential amplifier 24, furthermore a resistor R32, which is connected between the output of the amplifier 32 and the inverting input of the differential amplifier 24, and a resistor R32, which is connected between the output of the amplifier 32 and the inverting input of the differential amplifier 24.

Furthermore it includes a capacitor C31 which is connected between the inputs of the differential amplifier 24 and which capacitor is common to both of the integrating members and, therefore, it has a capacitive value which is twice that for one of the individual filter circuits. Here the storage and integrating function and the filtering function for the suppression of the high frequency noise N are separate and not performed by the same integrating network RC as in FIG. 1. In addition, in the circuit according to FIG. 2, during the closing period of the switch the received signal value is always present at the output terminal of the respective channel in an undelayed fashion, while when the switch is open, the average value of the received signal segment is present.

Figure 3:
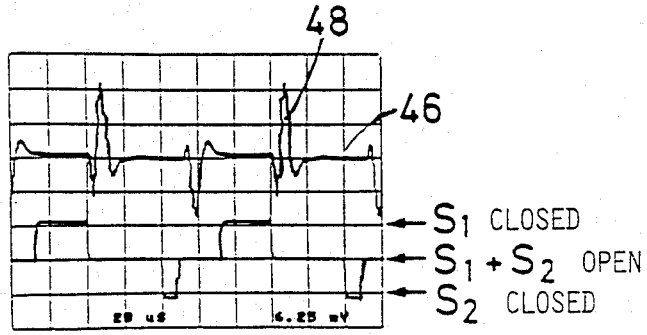
FIG. 3 is a diagram illustrating the operation of the switching circuit according to FIG. 1.

FIG. 3 illustrates an oscillogram 46 of a typical electrical input signal, such as received from a pulsed hot cathode ionization manometer at the terminal E of the lock-in amplifier and supplied to such terminal, and the amplitude of which in the given example is about tenfold of the information signal amplitude.

The lower curve illustrates the state of switching of both of the switching means $S_1$ and $S_2$. The lock-in amplifier circuit 14 according to FIG. 1 delivers for an input signal 46 according to FIG. 3 a completely smooth output voltage A of about 10 volt on the output terminal 26 of the differential amplifier.

The above described embodiments can be changed in a manner that more than a pair of switching means and signal channels can be used which may have in each pair a differential amplifier associated therewith. Also one may employ two or more lock-in amplifiers of the known art in a parallel operating fashion, when more than two phase conditions are to be received.

I claim:

1. A lock-in amplifier comprising an input terminal;
   (a) a pair of signal processing channels each having an input and an output
   (b) a switching arrangement coupled between said input terminal and inputs of said signal processing channels;
   (c) a signal combining circuit comprising an output, said combining circuit being connected between the outputs of said channels;
   (d) a switching control circuit having an input for a synchronizing signal, said switching control circuit being coupled to said switching arrangement;

wherein said switching arrangement comprises a pair of independently controllable switching means;

said switching control circuit including a pair of delay means connected between said synchronizing signal input and each of said associated switching means; and each of said signal processing channels comprising smoothing and storage means.

2. The lock-in amplifier according to claim 1, wherein each of said delay means has associated therewith a variable delay period, said delay periods of each of said delay means being adjustable independently from each other.

3. The lock-in amplifier according to claim 2, wherein said switching control circuit comprises a clocking circuit for each of said switching means, said clocking circuit producing a signal for controlling the closing of the associated one of said switching means.

4. The lock-in amplifier according to claim 3, wherein the period of said signals of the clocking circuit for controlling the closing of said switching means is adjustable independently from each other.

5. The lock-in amplifier according to claim 1, wherein said smoothing and storage means have adjustable time constants.

6. The lock-in amplifier according to claim 1, wherein the signal combining circuit comprises a differential amplifier.

7. The lock-in amplifier according to claim 1, wherein said signal combining circuit comprises smoothing means.

8. The lock-in amplifier according to claim 1, wherein each of said signal channels has an output terminal.

9. The lock-in amplifier according to claim 1, wherein each of said signal channels comprises an isolating amplifier.

* * * * *